(12) United States Patent
Li

(10) Patent No.: US 11,744,004 B2
(45) Date of Patent: Aug. 29, 2023

(54) CIRCUIT BOARD AND METHOD OF MANUFACTURING THE SAME

(71) Applicants: QING DING PRECISION ELECTRONICS (HUAIAN) CO., LTD, Huai an (CN); Avary Holding (Shenzhen) Co., Limited., Shenzhen (CN); GARUDA TECHNOLOGY CO., LTD., New Taipei (TW)

(72) Inventor: Wei-Xiang Li, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN); GARUDA TECHNOLOGY CO., LTD., New Taipei (TW)

( * ) Notice: Subject to any disclaimer, the term of this patent is extended or adjusted under 35 U.S.C. 154(b) by 112 days.

(21) Appl. No.: 17/464,935

(22) Filed: Sep. 2, 2021

(65) Prior Publication Data
US 2022/0346218 A1 Oct. 27, 2022

(30) Foreign Application Priority Data
Apr. 26, 2021 (CN) .......................... 202110455562.5

(51) Int. Cl.
*H05K 3/30* (2006.01)
*H05K 1/09* (2006.01)
(Continued)

(52) U.S. Cl.
CPC .......... *H05K 1/0206* (2013.01); *H05K 1/183* (2013.01); *H05K 3/064* (2013.01); *H05K 3/30* (2013.01);
(Continued)

(58) Field of Classification Search
CPC ...... H05K 1/0206; H05K 1/183; H05K 3/064; H05K 3/30; H05K 1/09; H05K 2201/064;
(Continued)

(56) References Cited

U.S. PATENT DOCUMENTS

| 7,190,581 | B1 * | 3/2007 | Hassani | H01L 25/072 |
| | | | | 361/698 |
| 2012/0199381 | A1 * | 8/2012 | Heo | H05K 1/0209 |
| | | | | 174/252 |
| 2021/0036416 | A1 * | 2/2021 | Yang | H01Q 1/36 |

FOREIGN PATENT DOCUMENTS

| CN | 105848405 A | * | 8/2016 |
| TW | 201630496 A | | 8/2016 |

* cited by examiner

*Primary Examiner* — Timothy J Thompson
*Assistant Examiner* — Michael F McAllister
(74) *Attorney, Agent, or Firm* — ScienBiziP, P.C.

(57) ABSTRACT

A circuit board includes a first outer wiring layer, a circuit substrate, and a second outer wiring layer stacked. The circuit substrate includes a first inner wiring layer, an insulating layer, and a second inner wiring layer stacked. A plurality of thermally conductive pillars is arranged at intervals on the first inner wiring layer, a liquid storage space is formed between every two adjacent thermally conductive pillars, and a thermally conductive agent is received in the liquid storage space. The first outer wiring layer is formed on the plurality of thermally conductive pillars. The second outer wiring layer is formed the second inner wiring layer. A first groove penetrates the second outer wiring layer, the second inner wiring layer and the insulating layer, exposes a portion of the first inner wiring layer, and corresponds to the thermally conductive pillars. At least one heating element is installed in the first groove.

16 Claims, 14 Drawing Sheets

(51) Int. Cl.
*H05K 1/02* (2006.01)
*H05K 3/06* (2006.01)
*H05K 1/18* (2006.01)

(52) U.S. Cl.
CPC ......... *H05K 1/09* (2013.01); *H05K 2201/064* (2013.01); *H05K 2201/09036* (2013.01); *H05K 2201/10151* (2013.01); *H05K 2203/0723* (2013.01)

(58) Field of Classification Search
CPC .......... H05K 2201/09036; H05K 2201/10151; H05K 2203/0723
USPC ....................................................... 361/699
See application file for complete search history.

CIRCUIT BOARD AND METHOD OF MANUFACTURING THE SAME

FIELD

The subject matter herein generally relates to a circuit board and a method of manufacturing the circuit board.

BACKGROUND

A camera module includes a heating element (for example, a sensor chip) and a circuit substrate, and the sensor chip is disposed on the circuit substrate. Under normal circumstances, heat generated by the sensing chip can be conducted through the circuit substrate and dissipated to the external environment. However, as the circuit substrate becomes lighter and thinner while functional electronic components continue to increase. The circuit substrate has a large thermal resistance, and the contact area between the circuit substrate and the sensor chip is limited. The sensing chip is prone to increase in temperature and difficult to dissipate heat after long-term operation, and may cause the sensing chip to burn out.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
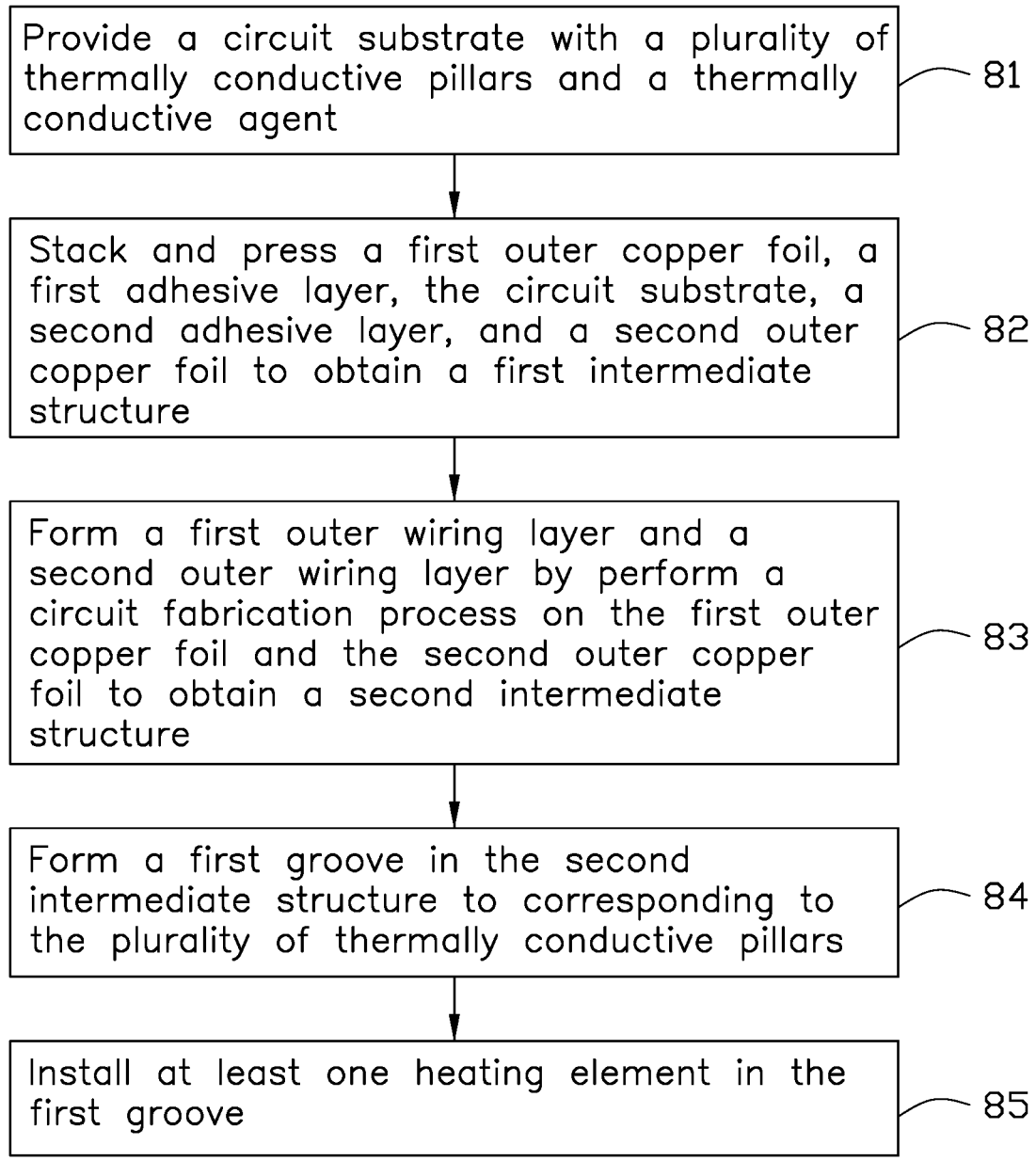
FIG. 1 is a flowchart of an embodiment of a method of manufacturing a circuit board according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with an embodiment. The embodiment method of manufacturing a circuit board (shown in FIG. 15) is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 81.

Figure 2:
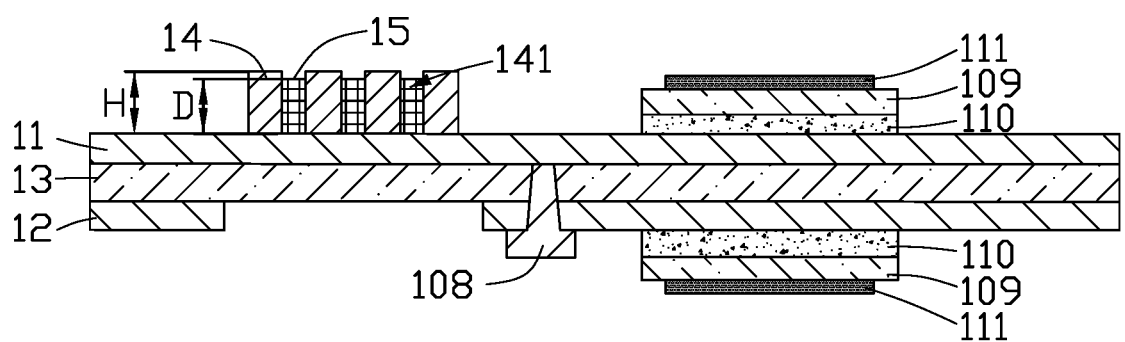
FIG. 2 is a cross-sectional view of an embodiment of a circuit substrate according to the present disclosure.

At block 81, referring to FIG. 2, a circuit substrate 10 is provided. The circuit substrate 10 includes a first inner wiring layer 11, a second inner wiring layer 12, an insulating layer 13, a plurality of thermally conductive pillars 14, and a thermally conductive agent 15. The insulating layer 13 is located between the first inner wiring layer 11 and the second inner wiring layer 12. The plurality of thermally conductive pillars 14 are arranged at intervals on a surface of the first inner wiring layer 11 facing away from the second inner wiring layer 12. A liquid storage space 141 is formed between every two adjacent thermally conductive pillars 14. The thermally conductive agent 15 is received in the liquid storage space 141.

Figure 3:
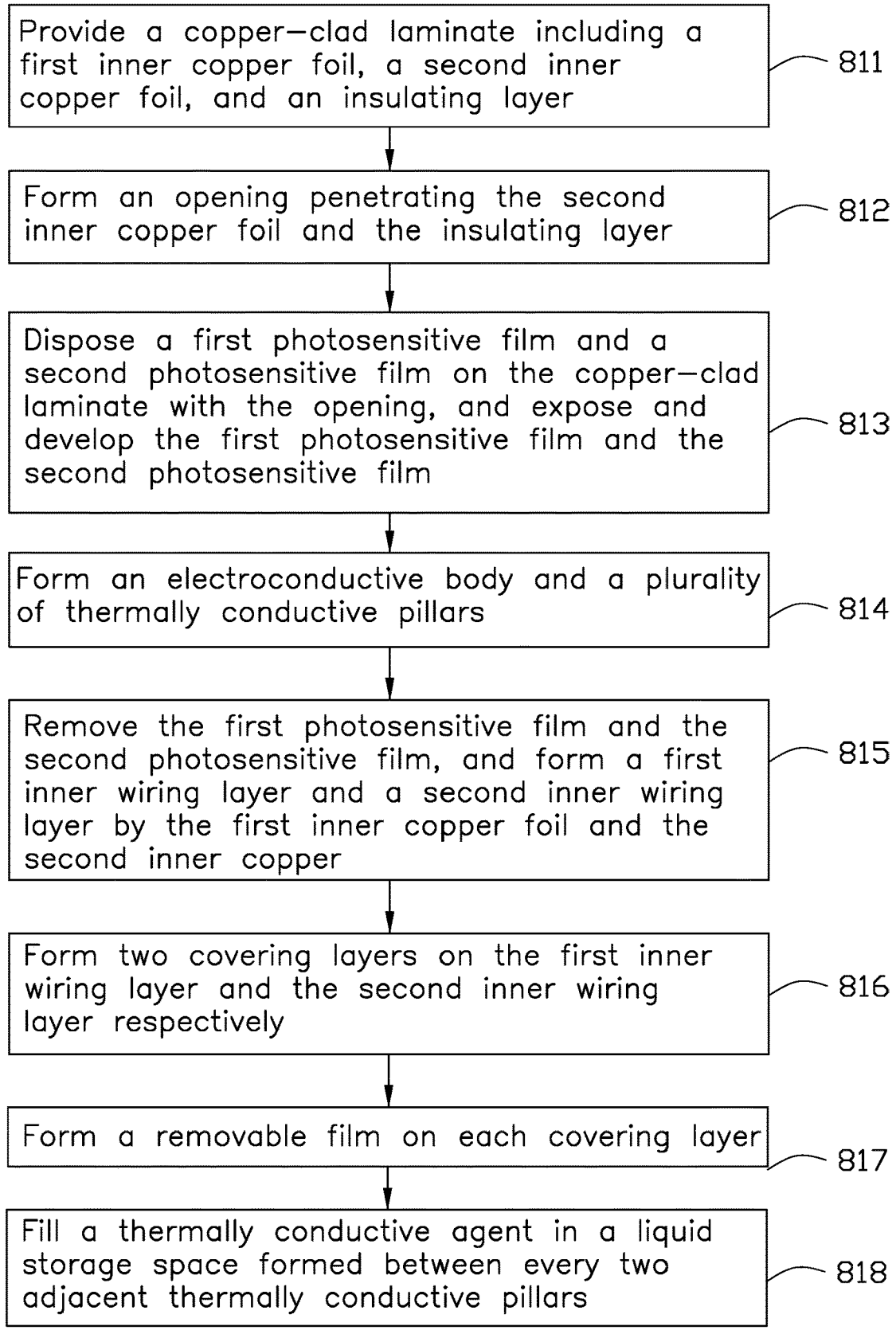
FIG. 3 is a flowchart of an embodiment of a method of manufacturing a circuit substrate according to the present disclosure.

FIG. 3 illustrates a flowchart of an embodiment of a method of manufacturing the circuit substrate 10. The method can begin at block 811.

Figure 4:
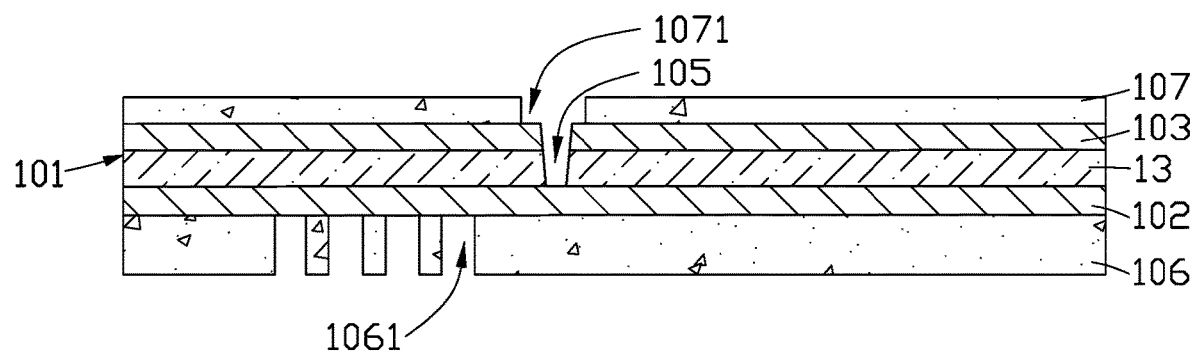
FIG. 4 is a cross-sectional view of an embodiment of a copper-clad laminate with an opening, a first photosensitive film, and a second photosensitive film according to the present disclosure.

At block 811, referring to FIG. 4, a copper-clad laminate 101 is provided. The copper-clad laminate 101 includes a first inner copper foil 102, a second inner copper foil 103, and an insulating layer 13. The insulating layer 13 is located between the first inner copper foil 102 and the second inner copper foil 103. In at least one embodiment, the insulating layer 13 may be made of polyimide.

At block 812, referring to FIG. 4, an opening 105 penetrating the second inner copper foil 103 and the insulating layer 13 is formed on the copper-clad laminate 101. A portion of the first inner copper foil 102 is exposed from the opening 105.

At block 813, referring to FIG. 4, a first photosensitive film 106 is disposed on a side of the first inner copper foil 102 facing away from the second inner copper foil 103, and a second photosensitive film 107 is disposed on a side of the second inner copper foil 103 facing away from the first inner copper foil 102. The first photosensitive film 106 and the second photosensitive film 107 are exposed and developed, so that a plurality of first through hole 1061 spaced from each other are formed on the first photosensitive film 106, and a second through hole 1071 communicating with the opening 105 is formed on the second photosensitive film 107. A portion of the first inner copper foil 102 is exposed from the plurality of first through hole 1061. A portion pf the first inner copper foil 102 is exposed from the second through hole 1071 and the opening 105.

Figure 5:
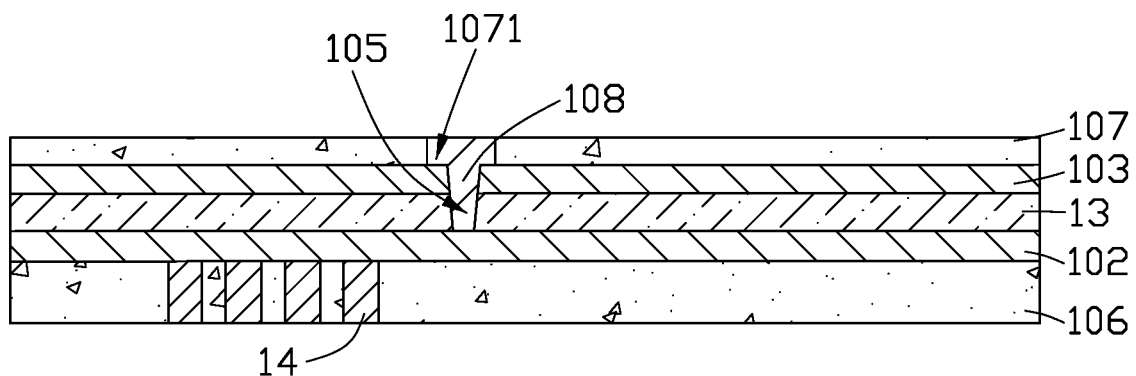
FIG. 5 is a cross-sectional view showing an electroconductive body in the opening of FIG. 4 and a plurality of thermally conductive pillars on the copper-clad laminate of FIG. 4.

At block 814, referring to FIG. 5, an electroconductive body 108 is formed in the second through hole 1071 and the opening 105 by electroplating, a plurality of thermally conductive pillars 14 are formed in the plurality of first through hole 1061 by electroplating. The electroconductive body 108 is electrically connected to the first inner copper foil 102 and the second inner copper foil 103. An end portion of each of the plurality of thermally conductive pillars 14 is connected to the first inner copper foil 102.

Figure 6:
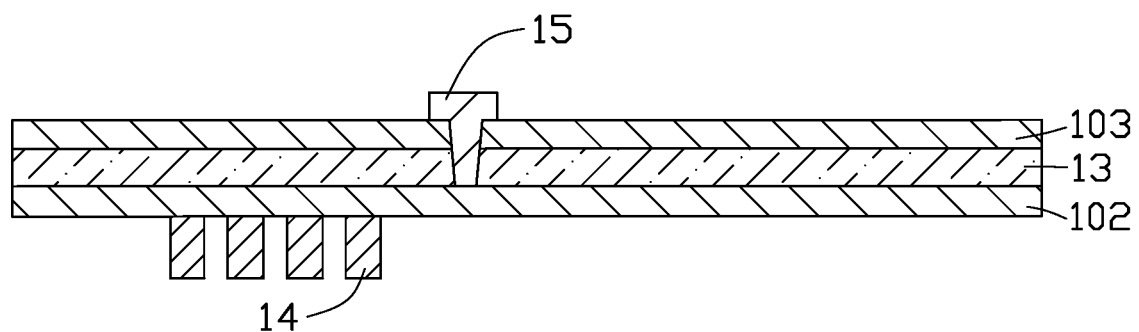
FIG. 6 is a cross-sectional view showing the first photosensitive film and second photosensitive film removed from the copper-clad laminate of FIG. 5.
Figure 7:
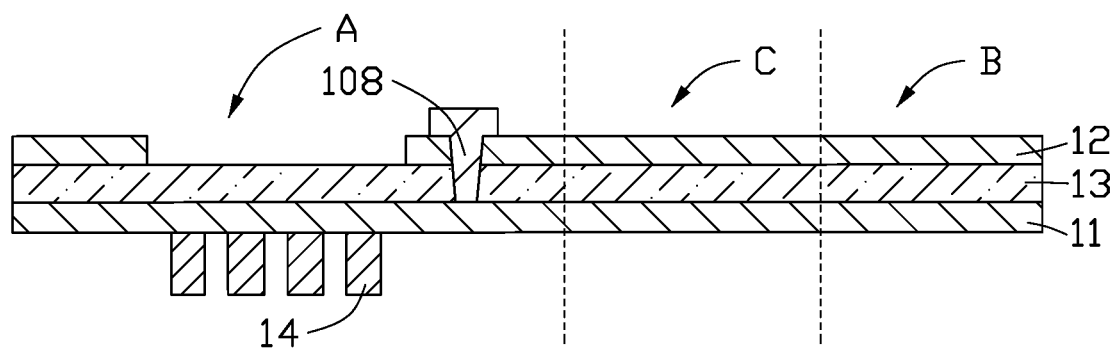
FIG. 7 is a cross-sectional view of an embodiment of an intermediate structure according to the present disclosure.

At block 815, referring to FIG. 6 and FIG. 7, the exposed and developed first photosensitive film 106 and the exposed and developed second photosensitive film 107 are removed, a first inner wiring layer 11 is formed by etching the first inner copper foil 102, and a second inner wiring layer 12 is formed by etching the second inner copper foil 103, thereby obtaining an intermediate structure 101a.

The intermediate structure 101a is divided into a first area A, a second area B, and a connecting area C. The connecting area C is located between the first area A and the second area B. The plurality of thermally conductive pillars 14 and the electroconductive body 108 is located in the first area A. The first area A is used for installing at least one heating element 70 (shown in FIG. 14).

Figure 8:
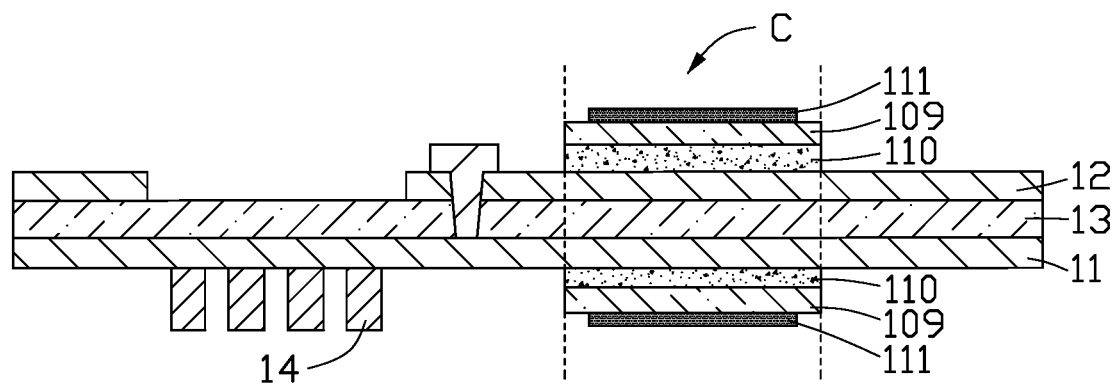
FIG. 8 is a cross-sectional view showing covering layers and removable films on the intermediate structure of FIG. 7.

At block 816, referring to FIG. 8, two covering layers 109 are respectively combined with an outer side of the first inner wiring layer 11 facing away from the second inner wiring layer 12 and an outer side of the second inner wiring layer 12 facing away from the first inner wiring layer 11 through adhesive layers 110.

At block 817, referring to FIG. 8, a removable film 111 is formed on a surface of each of the covering layers 109 facing away from the intermediate structure 101a.

In at least one embodiment, the removable film 111 may be made of a release glue.

At block 818, referring to FIG. 2, a thermally conductive agent 15 is filled in a liquid storage space 141 formed between every two adjacent thermally conductive pillars 14.

Figure 9:
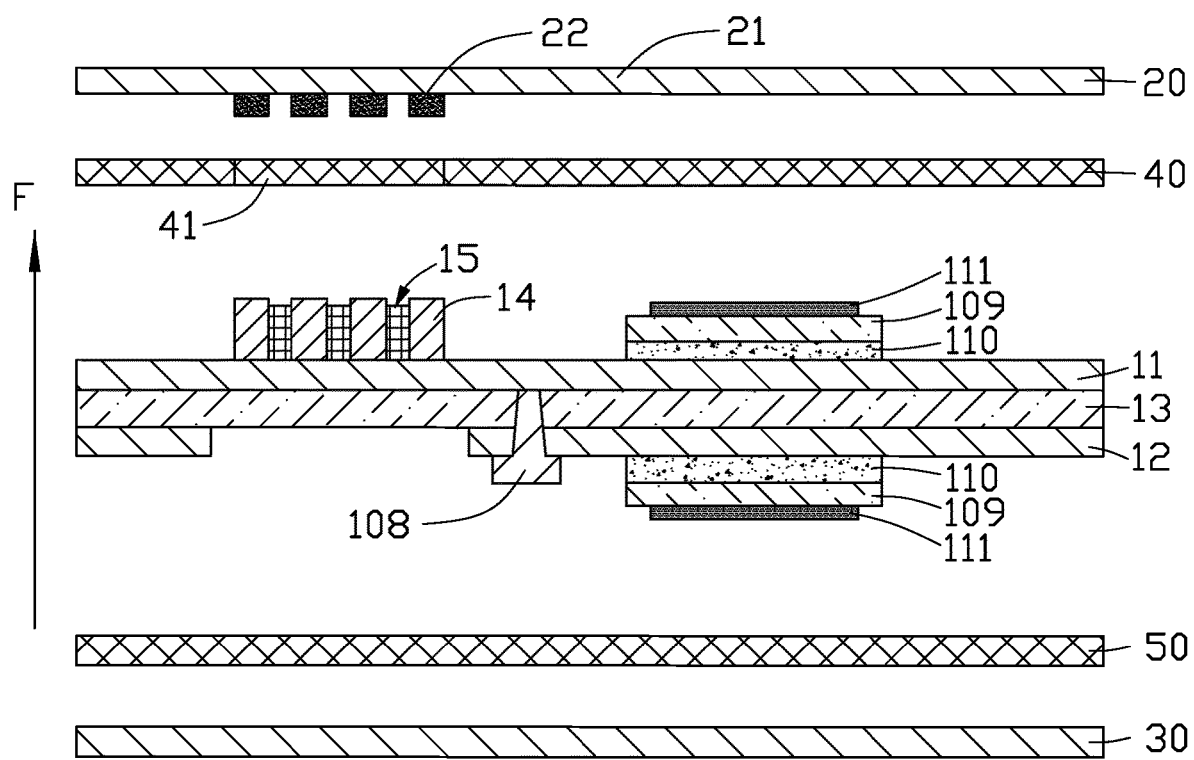
FIG. 9 is a cross-sectional view showing a first outer copper foil, a first adhesive layer, the circuit substrate, a second adhesive layer, and a second outer copper foil stacked.
Figure 10:
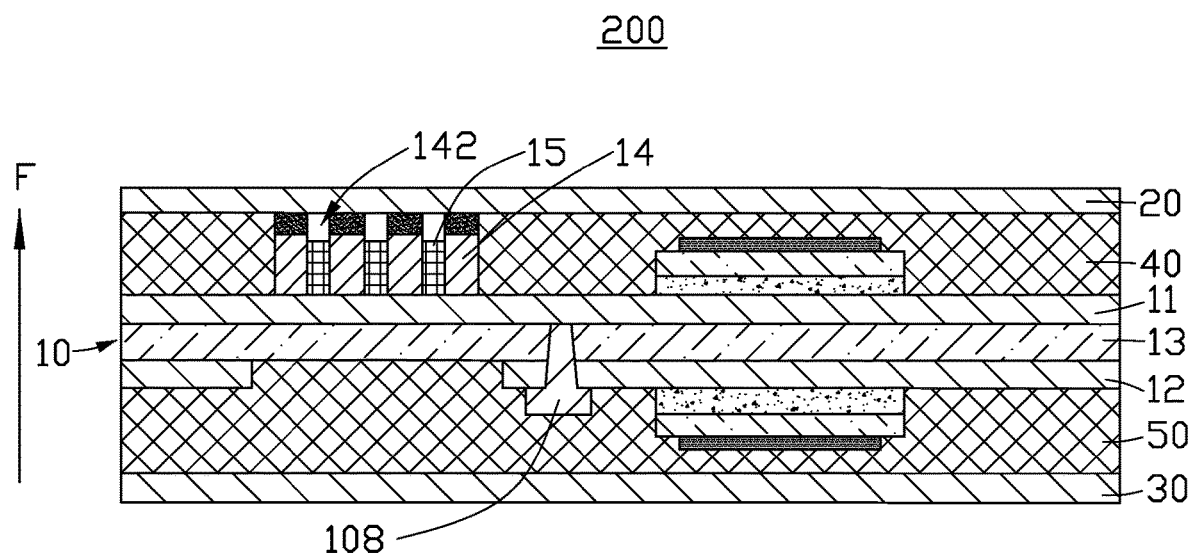
FIG. 10 is a cross-sectional view of an embodiment of a first intermediate structure according to the present disclosure.

At block 82, referring to FIG. 9 and FIG. 10, a first outer copper foil 20, a first adhesive layer 40, the circuit substrate 10, a second adhesive layer 50, and a second outer copper foil 30 are stacked in that sequence along a thickness direction F and pressed together to obtain a first intermediate structure 200. The first adhesive layer 40 is located between the first outer copper foil 20 and the first inner wiring layer 11, and the second adhesive layer 50 is located between the second outer copper foil 30 and the second inner wiring layer 12. An opening 41 penetrates the first adhesive layer 40, and the plurality of thermally conductive pillars 14 is received in the opening 41.

In at least one embodiment, an end of each liquid storage space 141 away from the first inner wiring layer 11 may be sealed by the first outer copper foil 20 to form a cavity 142.

In at least one embodiment, a volume of the thermally conductive agent 15 in one corresponding cavity 142 may be less than a volume of the corresponding the cavity 142.

In at least one embodiment, the first outer copper foil 20 may include a main plate 21 and a plurality of the connecting portions 22 on a side of the main plate 21. Each of the plurality of the connecting portions 22 is connected to one of the plurality of thermally conductive pillars 14. Each of the plurality of the connecting portions 22 may be a metal adhesive, so as to enhance a connection strength between the first outer copper foil 20 and the plurality of thermally conductive pillars 14 and fill a gap between the first outer copper foil 20 and each of the plurality of thermally conductive pillars 14.

Figure 11:
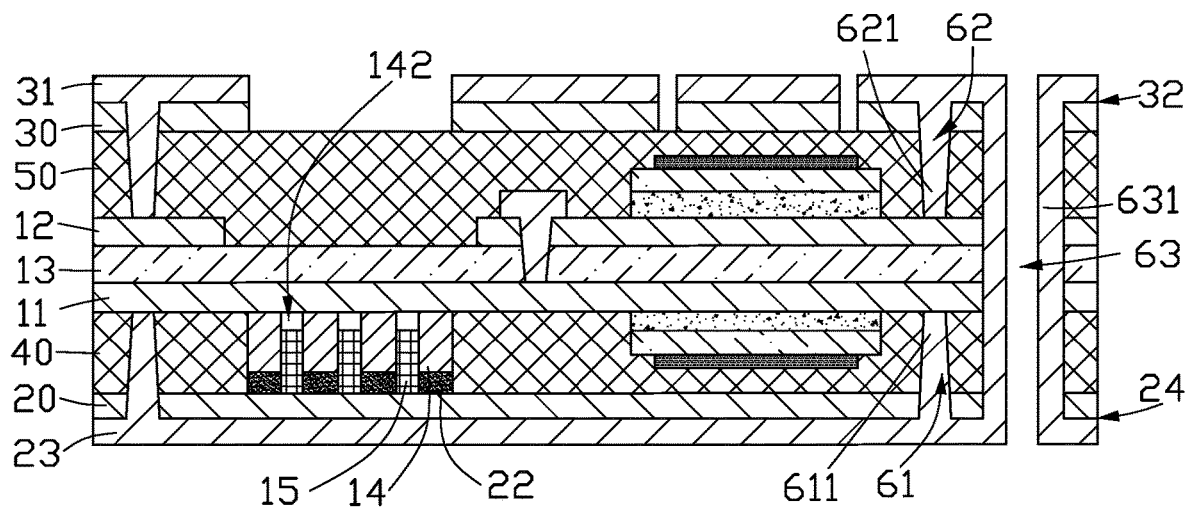
FIG. 11 is a cross-sectional view of an embodiment of a second intermediate structure according to the present disclosure.

At block 83, referring to FIG. 11, a first outer wiring layer 24 and a second outer wiring layer 32 are respectively formed by performing a circuit fabrication process on the first outer copper foil 20 and the second outer copper foil 30 of the first intermediate structure 200, thereby obtaining a second intermediate structure 200a.

In at least one embodiment, at least one first electroconductive via 611 may be formed to be electrically connected to the first outer wiring layer 24 and the first inner wiring layer 11. At least one second electroconductive via 621 may be formed to be electrically connected to the second outer wiring layer 32 and the second inner wiring layer 12. At least one third electroconductive via 631 may be formed to be electrically connected to the first outer wiring layer 24 and the second outer wiring layer 32.

In at least one embodiment, specifically, at least one first hole 61 penetrating the first outer copper foil 20 and the first adhesive layer 40 is formed on the first intermediate structure 200, and exposes a portion of the first inner wiring layer 11. At least one second hole 62 penetrating the second outer copper foil 30 and the second adhesive layer 50 is formed on the first intermediate structure 200, and exposes a portion of the second inner wiring layer 12. At least one third hole 63 penetrating the first outer copper foil 20, the first adhesive layer 40, the circuit substrate 10, the second adhesive layer 50, and the second outer copper foil 30 is formed on the first intermediate structure 200.

A first electroplating layer 23 is formed on the first outer copper foil 20 facing away from the second outer copper foil 30, and a second electroplating layer 31 is formed on the second outer copper foil 30 facing away from the first outer copper foil 20. Then, the first electroplating layer 23 and the first outer copper foil 20 are etched to formed the first outer wiring layer 24, the second electroplating layer 31 and the second outer copper foil 30 are etched to formed the second outer wiring layer 32.

At least one first electroconductive via 611, at least one second electroconductive via 621, at least one third electroconductive via 631 are respectively formed by electroplating the at least one first hole 61, the least one second hole 62, and the least one third hole 63.

Figure 12:
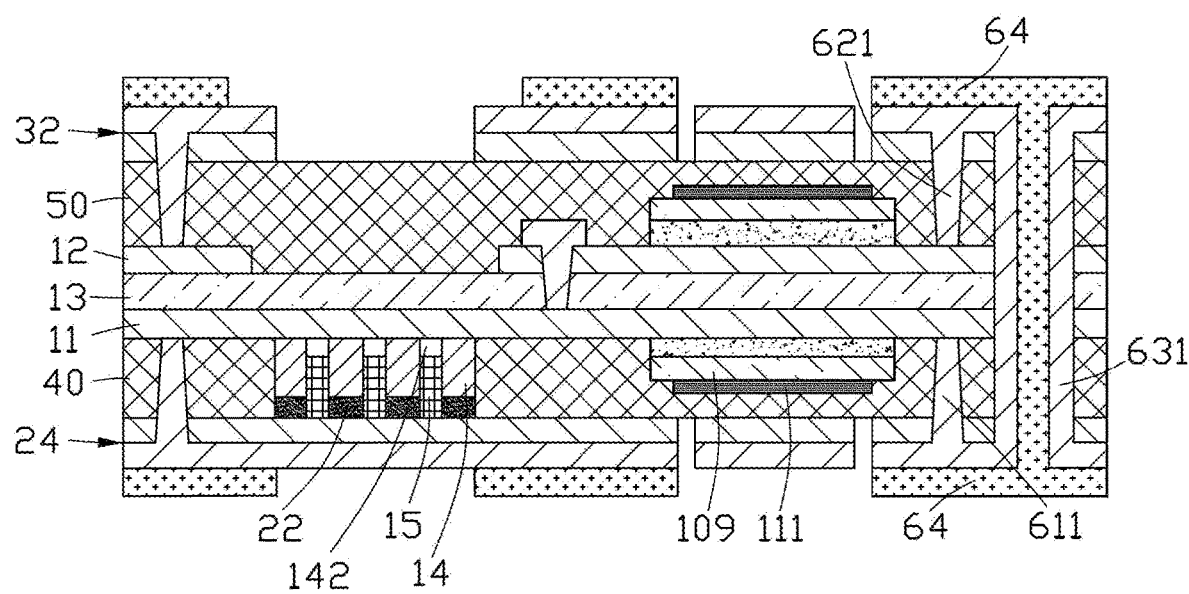
FIG. 12 is a cross-sectional view of another embodiment of a second intermediate structure according to the present disclosure.

In at least one embodiment, referring to FIG. 12, the block 83 may further include forming a solder mask 64 on the first outer wiring layer 24 and forming a solder mask 64 on the second outer wiring layer 32.

The solder masks 64 may further be filled in the least one third electroconductive via 631.

Figure 13:
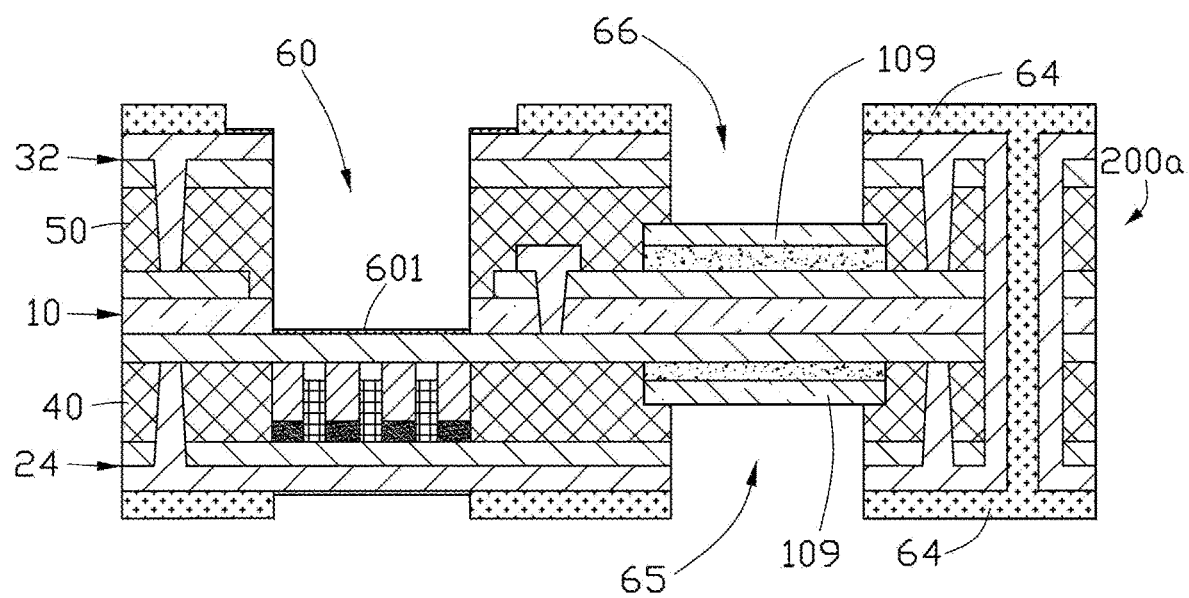
FIG. 13 is a cross-sectional view showing a first groove, a second groove, and a third groove formed in the second intermediate structure of FIG. 12.

At block 84, referring to FIG. 13, a first groove 60 penetrating the second outer wiring layer 32, the second adhesive layer 50, the second inner wiring layer 12, and the insulating layer 13 along the thickness direction F is formed in the second intermediate structure 200a, and exposes a portion of the first inner wiring layer 11. The first groove 60 corresponds to the plurality of thermally conductive pillars 14 along the thickness direction F.

In at least one embodiment, a second groove 65 corresponding the connecting area C and penetrating the first outer wiring layer 24 and first adhesive layer 40 along the thickness direction F is formed in the second intermediate structure 200a, and expose the removable film 111 on the outer side of the first inner wiring layer 11. A third groove 66 corresponding the connecting area C and penetrating the second outer wiring layer 32 and the second adhesive layer 50 along the thickness direction F is formed in the second intermediate structure 200a, and expose the removable film 111 on the outer side of the second inner wiring layer 12. Then, the exposed removable films 111 are removed.

In at least one embodiment, the second groove 65 may further penetrate the solder mask 64 on the first outer wiring layer 24, and the third groove 66 may further penetrate the solder mask 64 on the second outer wiring layer 32.

Figure 14:
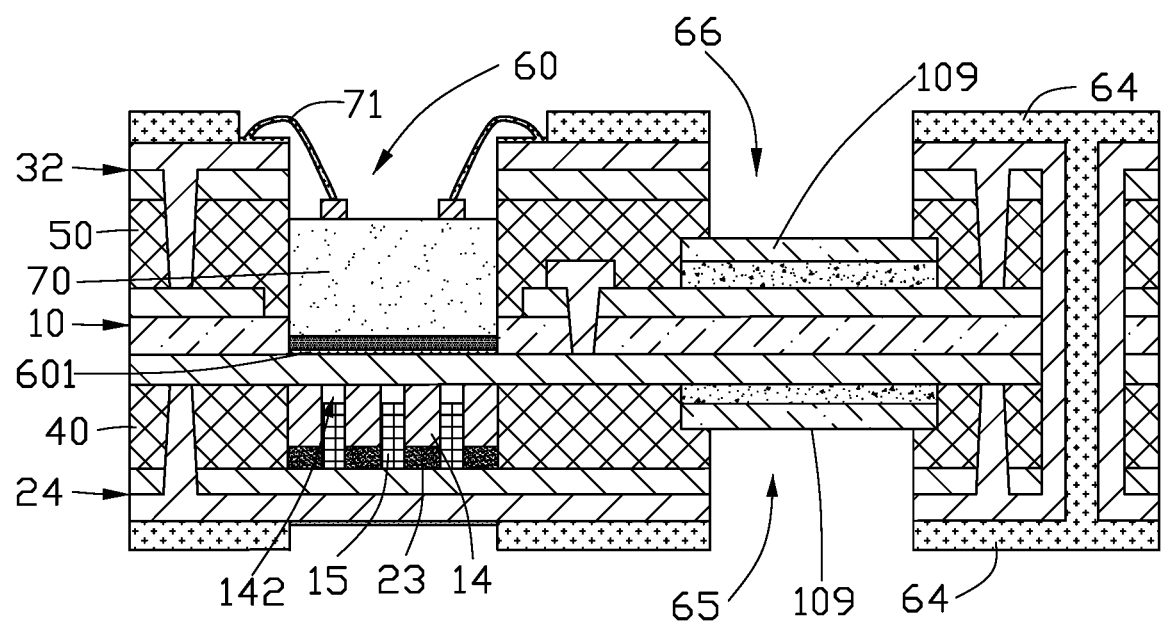
FIG. 14 is a cross-sectional view of an embodiment of a circuit board according to the present disclosure.

At block 85, referring to FIG. 14, at least one heating element 70 is installed in the first groove 60 and is electrically connected to the second intermediate structure 200a, thereby obtaining the circuit board 100.

In at least one embodiment, before installing the at least one heating element 70, a metal layer 601 may be formed on the portion of the first inner wiring layer 11 exposed from the first groove 60. The at least one heating element 70 is attached to the metal layer 601. The metal layer 601 may be made of nickel-palladium-gold, and is used for enhancing a thermal conductivity between the heating element 70 and the first inner wiring layer 11.

In at least one embodiment, the at least one heating element 70 may be electrically connected to the second outer wiring layer 32 by metal wires 71.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

FIG. 14 illustrates an embodiment of a circuit board 100. The circuit board 100 may be applied in camera. The circuit board 100 includes a first outer wiring layer 24, a circuit substrate 10, a second outer wiring layer 32 stacked along a thickness direction F. The circuit board 100 further includes a first adhesive layer 40 combined between the first outer wiring layer 24 and the circuit substrate 10, a second adhesive layer 50 combined between the circuit substrate 10 and the second outer wiring layer 32. At least one heating element 70 may be embedded into the circuit board 100.

The circuit substrate 10 includes a first inner wiring layer 11, a second inner wiring layer 12, an insulating layer 13, a plurality of thermally conductive pillars 14, and a thermally conductive agent 15.

The insulating layer 13 is located between the first inner wiring layer 11 and the second inner wiring layer 12. The first outer wiring layer 24 is located on a side of the first inner wiring layer 11 facing away from the second inner wiring layer 12, and the second outer wiring layer 32 is located on a side of the second inner wiring layer 12 facing away from the first inner wiring layer 11. The plurality of thermally conductive pillars 14 are arranged at intervals along a direction perpendicular to the thickness direction F and are located between the first outer wiring layer 24 and the first inner wiring layer 11. A liquid storage space 141 is formed between every two adjacent thermally conductive pillars 14. The thermally conductive agent 15 is received in the liquid storage space 141. In at least one embodiment, opposite ends of each liquid storage space 141 are respectively sealed by the first inner wiring layer 11 and the first outer wiring layer 24 to form a cavity 142. In at least one embodiment, a volume of the thermally conductive agent 15 in one corresponding cavity 142 may be less than a volume of the corresponding the cavity 142.

A first groove 60 penetrates the second outer wiring layer 32, the second adhesive layer 50, the second inner wiring layer 12, and the insulating layer 13 along the thickness direction F, and exposes a portion of the first inner wiring layer 11. The first groove 60 corresponds to the plurality of thermally conductive pillars 14 along the thickness direction F. The at least one heating element 70 is embedded in the first groove 60.

During operation, the heat generated by the at least one heating element 70 is conducted to the plurality of thermally conductive pillars 14 via the first inner circuit board 11. The thermally conductive agent 15 absorbs the heat of the plurality of thermally conductive pillars 14 and undergoes a phase change to transform into thermally conductive steam. The heat absorbed by the thermally conductive agent 15 is conducted to the first outer wiring layer 24. The heat generated by the at least one heating element 70 is conducted to thermally conductive agent 15, and the thermally conductive agent 15 forms thermal convection in the cavity 142, thereby accelerating the heat dissipation efficiency.

In at least one embodiment, the circuit board 100 may further include a plurality of connecting portions 22, each of the plurality of connecting portions 22 is combined between the first outer wiring layer 24 and one of the plurality of thermally conductive pillars 14 to prevent heat conduction steam from escaping from the cavity 142.

In at least one embodiment, the thermally conductive agent 15 may be selected from a group consisting of conducting oil, ammonia water, water, and any combination thereof.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method of manufacturing a circuit board comprising:
providing a circuit substrate comprising a first inner wiring layer, a second inner wiring layer, an insulating layer, a plurality of thermally conductive pillars, and a thermally conductive agent, wherein the insulating layer is located between the first inner wiring layer and the second inner wiring layer, the plurality of thermally conductive pillars are arranged at intervals on a surface of the first inner wiring layer facing away from the second inner wiring layer, a liquid storage space is formed between every two adjacent thermally conductive pillars, and the thermally conductive agent is received in the liquid storage space;
forming a first outer wiring layer on a side of the plurality of thermally conductive pillars facing away from the first inner wiring layer, and forming a second outer wiring layer on a side of the second inner wiring layer facing away from the first inner wiring layer, thereby obtaining an intermediate structure, wherein an end of the liquid storage space away from the first inner wiring layer is sealed by the first outer wiring layer to form a cavity;

forming a first groove penetrating the second outer wiring layer, the second inner wiring layer, and the insulating layer along a thickness direction of the intermediate structure, wherein the first groove exposes a portion of the first inner wiring layer, and corresponds to the plurality of thermally conductive pillars along the thickness direction; and installing at least one heating element in the first groove, thereby obtaining the circuit board.

2. The method of claim 1, wherein a volume of the thermally conductive agent in one corresponding cavity is less than a volume of the corresponding the cavity.

3. The method of claim 1, wherein a method of manufacturing the circuit substrate comprising:

providing a copper-clad laminate comprising a first inner copper foil, a second inner copper foil, and an insulating layer, wherein the insulating layer is located between the first inner copper foil and the second inner copper foil;

forming a first photosensitive film on a side of the first inner copper foil facing away from the second inner copper foil, wherein the first photosensitive film comprises a plurality of first through hole spaced from each other to expose a portion of the first inner copper foil;

forming a plurality of thermally conductive pillars in the plurality of first through hole by electroplating, wherein a liquid storage space is formed between every two adjacent thermally conductive pillars;

removing the first photosensitive film;

etching the first inner copper foil to form a first inner wiring layer, and etching the second inner wiring layer to form a second inner wiring layer; and filling a thermally conductive agent in the liquid storage space.

4. The method of claim 3, wherein the method of manufacturing the circuit substrate further comprising:

forming two covering layers combined with an outer side of the first inner wiring layer facing away from the second inner wiring layer and an outer side of the second inner wiring layer facing away from the first inner wiring layer, respectively;

after obtaining the intermediate structure, the method of manufacturing the circuit board further comprising:

forming a second groove and a third groove corresponding to the second groove along the thickness direction to expose the covering layers.

5. The method of claim 3, wherein a method of forming the first outer wiring layer on a side of the plurality of thermally conductive pillars facing away from the first inner wiring layer comprising:

pressing a first outer copper foil on a side of the plurality of thermally conductive pillars facing away from the first inner wiring layer;

forming a first electroplating layer on the first outer copper foil facing away from the first inner wiring layer; and etching the first electroplating layer and the first outer copper foil to form the first outer wiring layer.

6. The method of claim 3, wherein a method of forming the second outer wiring layer on a side of the second inner wiring layer facing away from the first inner wiring layer comprising:

pressing a second outer copper foil on a side of the second inner wiring layer facing away from the first inner wiring layer;

forming a second electroplating layer on the second outer copper foil facing away from the second inner wiring layer; and etching the second electroplating layer and the second outer copper foil to form the second outer wiring layer.

7. The method of claim 1, wherein the first outer copper foil comprises a main plate and a plurality of the connecting portions on a side of the main plate, each of the plurality of the connecting portions is combined between the main plate and one of the plurality of thermally conductive pillars.

8. The method of claim 1, wherein the thermally conductive agent is selected from a group consisting of conducting oil, ammonia water, water, and any combination thereof.

9. The method of claim 1, wherein before installing at least one heating element in the first groove, further comprising:

forming a metal layer on the portion of the first inner wiring layer exposed from the first groove;

installing at least one heating element by attaching the at least one heating element to the metal layer.

10. The method of claim 9, wherein the metal layer is made of nickel-palladium-gold.

11. A circuit board comprising:

a circuit substrate comprising a first inner wiring layer, a second inner wiring layer, an insulating layer, a plurality of thermally conductive pillars, and a thermally conductive agent, wherein the insulating layer is located between the first inner wiring layer and the second inner wiring layer, the plurality of thermally conductive pillars are arranged at intervals on a surface of the first inner wiring layer facing away from the second inner wiring layer, a liquid storage space is formed between every two adjacent thermally conductive pillars, and the thermally conductive agent is received in the liquid storage space;

a first outer wiring layer formed on a side of the plurality of thermally conductive pillars facing away from the first inner wiring layer, wherein an end of the liquid storage space away from the first inner wiring layer is sealed by the first outer wiring layer to form a cavity;

a second outer wiring layer formed on a side of the second inner wiring layer facing away from the first inner wiring layer; and at least one heating element;

wherein a first groove penetrates the second outer wiring layer, the second inner wiring layer, and the insulating layer along a thickness direction of the circuit board, exposes a portion of the first inner wiring layer, and corresponds to the plurality of thermally conductive pillars along the thickness direction; the at least one heating element is installed in the first groove.

12. The circuit board of claim 11, wherein a volume of the thermally conductive agent in one corresponding cavity is less than a volume of the corresponding the cavity.

13. The circuit board of claim 11, wherein the circuit board further comprises a plurality of connecting portions, wherein each of the plurality of the connecting portions is combined between the first outer wiring layer and one of the plurality of thermally conductive pillars.

14. The circuit board of claim 11, wherein the thermally conductive agent is selected from a group consisting of conducting oil, ammonia water, water, and any combination thereof.

15. The circuit board of claim 11, wherein a metal layer is formed on the portion of the first inner wiring layer exposed from the first groove, the at least one heating element is attached to the metal layer.

16. The circuit board of claim 15, wherein the metal layer is made of nickel-palladium-gold.

* * * * *